(12) United States Patent
Cheng (10) Patent No.: US 11,316,249 B2
(45) Date of Patent: Apr. 26, 2022

(54) SEMICONDUCTOR DEVICE PACKAGE

(71) Applicant: Advanced Semiconductor Engineering, Inc., Kaohsiung (TW)

(72) Inventor: Hung-Hsiang Cheng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 40 days.

(21) Appl. No.: 16/806,460

(22) Filed: Mar. 2, 2020

(65) Prior Publication Data

US 2021/0273315 A1    Sep. 2, 2021

(51) Int. Cl.
| | |
|---|---|
| *H01L 23/538* | (2006.01) |
| *H01Q 1/22* | (2006.01) |
| *H01L 23/31* | (2006.01) |
| *H01L 23/66* | (2006.01) |
| *H01L 23/552* | (2006.01) |
| *H01L 21/683* | (2006.01) |
| *H01L 25/065* | (2006.01) |

(52) U.S. Cl.
CPC ....... *H01Q 1/2283* (2013.01); *H01L 21/6835* (2013.01); *H01L 23/3128* (2013.01); *H01L 23/5383* (2013.01); *H01L 23/5386* (2013.01); *H01L 23/552* (2013.01); *H01L 23/66* (2013.01); *H01L 25/0655* (2013.01); *H01L 2221/68345* (2013.01); *H01L 2221/68359* (2013.01); *H01L 2223/6677* (2013.01)

(58) Field of Classification Search
CPC . H01Q 1/2283; H01L 23/3128; H01L 23/552; H01L 21/6835; H01L 23/66; H01L 23/5383; H01L 23/5386; H01L 25/0655; H01L 2221/68359; H01L 2223/6677; H01L 2221/68345
USPC .......................................................... 257/659
See application file for complete search history.

(56) References Cited

U.S. PATENT DOCUMENTS

| | | | |
|---|---|---|---|
| 7,808,798 B2* | 10/2010 | Cotte | H01L 25/165 361/763 |
| 9,246,209 B2 | 1/2016 | Han et al. | |
| 2013/0141284 A1* | 6/2013 | Jeong | H01Q 1/2283 343/700 MS |
| 2017/0077039 A1* | 3/2017 | Liao | H01L 21/561 |
| 2019/0027804 A1* | 1/2019 | Kim | H01Q 21/0025 |

* cited by examiner

*Primary Examiner* — Vu A Vu
(74) *Attorney, Agent, or Firm* — Foley & Lardner LLP (57) ABSTRACT

The present disclosure provides a semiconductor device package. The semiconductor device package includes a first substrate having a first surface and a second surface opposite to the first surface, an antenna module disposed on the first surface of the first substrate, an electronic component module disposed on the first surface of the first substrate, and a first package body encapsulating the antenna module and the electronic component module. The antenna module has a first surface facing the first surface of the first substrate, a second surface opposite to the first surface of the antenna module, and a lateral surface extending between the first surface of the antenna module and the second surface of the antenna module. The lateral surface of the antenna module faces the electronic component module. A method of manufacturing a semiconductor device package is also provided.

18 Claims, 12 Drawing Sheets

SEMICONDUCTOR DEVICE PACKAGE

BACKGROUND

1. Technical Field

The present disclosure generally relates to a semiconductor device package and a method of manufacturing the same, and to a semiconductor device package including an antenna.

2. Description of the Related Art

In a semiconductor device package with an antenna layer and a radio frequency (RF) routing layer, the RF routing layer is generally thick enough to maintain the symmetry of the whole package. However, as the number of dielectric layers of the RF routing layer increases, the yield rate would decrease. In addition, the copper laying rate of the antenna layer is usually lower than the copper laying rate of the RF routing layer, and the copper laying rate mismatch renders processing difficulties.

SUMMARY

In one or more embodiments, a semiconductor device package includes a first substrate having a first surface and a second surface opposite to the first surface, an antenna module disposed on the first surface of the first substrate, an electronic component module disposed on the first surface of the first substrate, and a first package body encapsulating the antenna module and the electronic component module. The antenna module has a first surface facing the first surface of the first substrate, a second surface opposite to the first surface of the antenna module, and a lateral surface extending between the first surface of the antenna module and the second surface of the antenna module. The lateral surface of the antenna module faces the electronic component module.

In one or more embodiments, a semiconductor device package includes a first substrate having a first surface and a second surface opposite to the first surface, an electronic component module disposed on the first surface of the first substrate, and an antenna module disposed on the first surface of the first substrate and side by side with the electronic component module. The antenna module includes a first antenna layer. The semiconductor device package further includes a package body encapsulating the antenna module, and a second antenna layer disposed on the package body and substantially aligned with the first antenna layer.

In one or more embodiments, a method of manufacturing a semiconductor device package includes providing a carrier and disposing an antenna module on the carrier. The antenna module has an antenna pattern and a feeding line connected with the antenna pattern. The method further includes removing the carrier to expose a portion of the feeding line. The method further includes after removing the carrier, forming a grounding layer in corresponding to the antenna pattern.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Figure 1:
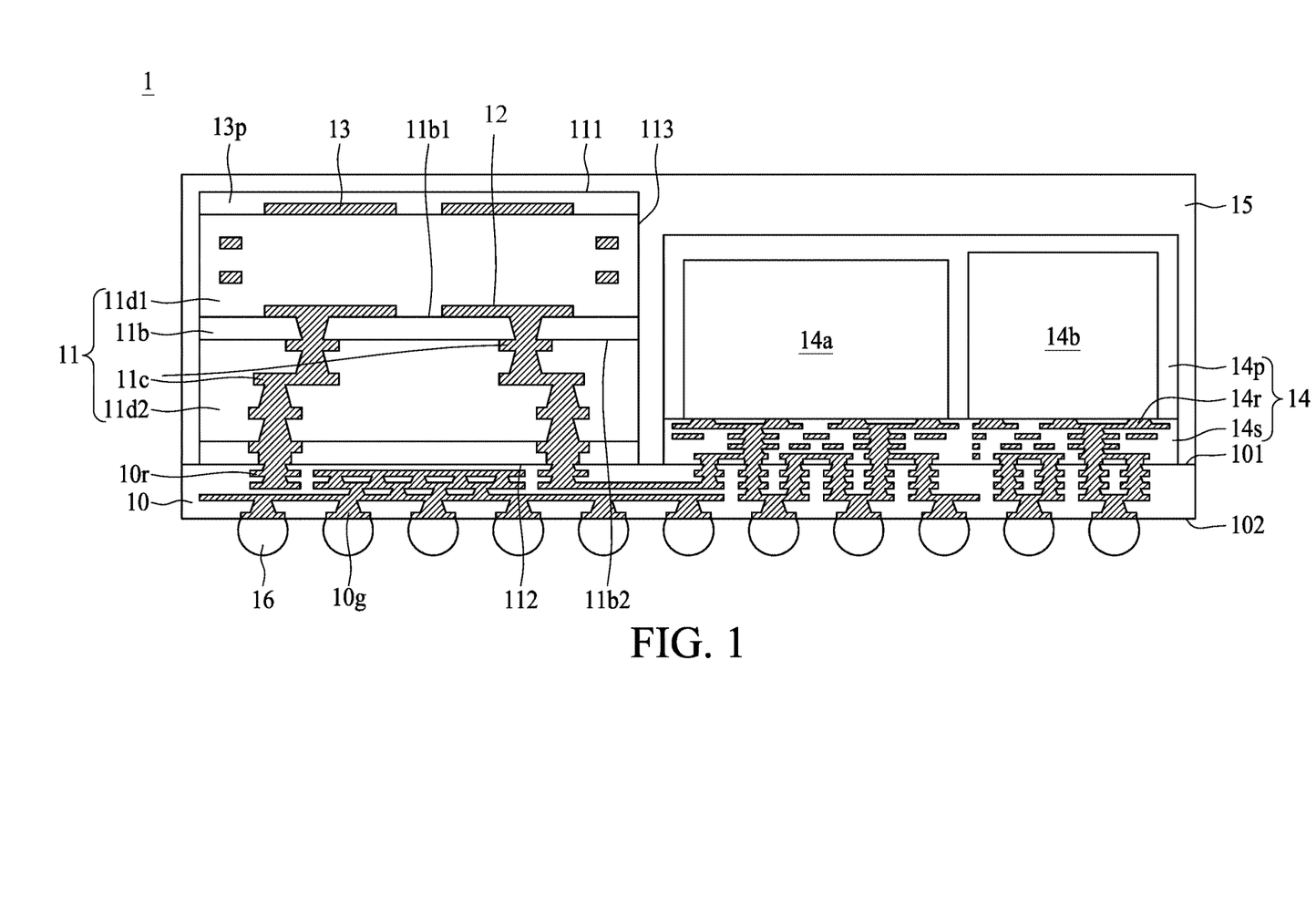
FIG. 1 illustrates a cross-sectional view of a semiconductor device package in accordance with some embodiments of the present disclosure.

FIG. 1 illustrates a cross-sectional view of a semiconductor device package 1 in accordance with some embodiments of the present disclosure. The semiconductor device package 1 includes a substrate 10, an antenna module 11, antenna patterns 12 and 13, an electronic component module 14, a package body 15, and electrical contacts 16.

The substrate 10 has a surface 101 and a surface 102 opposite the surface 101. The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) 10r. The RDL 10r may be covered by a dielectric layer and partially exposed from the surface 101 and the surface 102.

As shown in FIG. 1, the substrate 10 may include a grounding layer 10g disposed within the substrate 10. The grounding layer 10g is disposed outside of the antenna module 11. In some embodiments, the grounding layer 10g may be formed in corresponding to the antenna pattern 12 and/or the antenna pattern 13. In some embodiments, the grounding layer 10g may be aligned with the antenna pattern 12 and/or the antenna pattern 13.

In some embodiments, the grounding layer 10g may be disposed within the antenna module 11. For example, the grounding layer 10g may be disposed in a dielectric layer (e.g., a dielectric layer in a set of dielectric layer(s) 11d2) of the antenna module 11. In such embodiments, another dielectric layer (e.g., a dielectric layer in a set of dielectric layer(s) 11d1) needs to be added in order to maintain the symmetry of the antenna module 11. By disposing the grounding layer 10g outside of the antenna module 11, the number of dielectric layers of the antenna module 11 can be further decreased and the mismatch in copper laying rate can be reduced. Therefore, the yield rate can be improved.

The antenna module 11 is disposed on the surface 101 of the substrate 10. The antenna module 11 has a surface 111 facing away from the substrate 10, a surface 112 opposite to the surface 111, and a lateral surface 113 extending between the surface 111 and the surface 112.

The lateral surface 113 of the antenna module 11 faces the electronic component module 14. In other words, the antenna module 11 and the electronic component module 14 are placed side-by-side on the substrate 10.

The antenna module 11 includes a substrate 11b, a set of dielectric layer(s) 11d1, a set of dielectric layer(s) 11d2, a conductive material and/or structure, and the antenna patterns 12 and 13. The conductive material and/or structure may include a plurality of traces. For example, the conductive material and/or structure may include a feeding line 11c.

The substrate 11b has a surface 11b1 facing away from the substrate 10 and a surface 11b2 opposite to the surface 11b1. The set of dielectric layer(s) 11d1 is disposed on the surface 11b1 and the set of dielectric layer(s) 11d2 is disposed on the surface 11b2.

The number of the layer(s) of the set of dielectric layer(s) 11d1 and the number of the layer(s) of the set of dielectric layer(s) 11d2 are integers greater than zero. In some embodiments, the number of the layer(s) of the set of dielectric layer(s) 11d1 and the number of the layer(s) of the set of dielectric layer(s) 11d2 may be the same. For example, there may be 4 dielectric layers on the surface 11b1 of the substrate 11b, and there may be 4 dielectric layers on the surface 11b2 of the substrate 11b. For example, there may be 3 dielectric layers on the surface 11b1 of the substrate 11b, and there may be 3 dielectric layers on the surface 11b2 of the substrate 11b.

In some embodiments, the thickness of the set of dielectric layer(s) 11d1 and the thickness of the set of dielectric layer(s) 11d2 may be substantially the same. In some embodiments, in a manufacturing process of the antenna module 11, the substrate 11b is provided, and then the set of dielectric layer(s) 11d1 and the set of dielectric layer(s) 11d2 are provided on the opposite sides of the substrate 11b, respectively, in order to maintain the symmetry of the antenna module 11. Identical thickness of the set of dielectric layer(s) 11d1 and the set of dielectric layer(s) 11d2 can balance the stress introduced from the dielectric layer(s) and help to mitigate warpage.

In some embodiments, each layer of the set of dielectric layer(s) 11d1 and the set of dielectric layer(s) 11d2 may include, but is not limited to, an organic material, a solder mask, a polyimide (PI), an Ajinomoto build-up film (ABF), one or more molding compounds, one or more pre-impregnated composite fibers (e.g., a pre-preg material), a borophosphosilicate glass (BPSG), a silicon oxide, a silicon nitride, a silicon oxynitride, an undoped silicate glass (USG), any combination thereof, or the like. Examples of molding compounds may include, but are not limited to, an epoxy resin including fillers dispersed therein. Examples of a pre-preg material may include, but are not limited to, a multi-layer structure formed by stacking or laminating a number of pre-impregnated materials or sheets. In some embodiments, each layer of the set of dielectric layer(s) 11d1 and the set of dielectric layer(s) 11d2 may include may include an inorganic material, such as a silicon-oxide ($SiO_x$), a silicon-nitride ($SiN_x$), a tantalum oxide ($TaO_x$) or the like. In some embodiments, the substrate 11b may have a material as listed above for the set of dielectric layer(s) 11d1 and the set of dielectric layer(s) 11d2.

The antenna pattern 12 is disposed within at least one of the set of dielectric layer(s) 11d1. For example, the antenna pattern 12 is disposed on the substrate 11b. For example, the antenna pattern 12 is encapsulated by the set of dielectric layer(s) 11d1.

The antenna pattern 13 is disposed on the set of dielectric layer(s) 11d1. A lateral surface of the antenna pattern 13 can be covered or in contact with a protection layer 13p. The antenna pattern 13 can be embedded within the protection layer 13p. In some embodiments, the protection layer 13p may include a solder resist or solder mask.

The antenna pattern 12 is aligned with the antenna pattern 13. In the embodiments, signals can be transmitted between the antenna pattern 12 and the antenna pattern 13 through coupling. The antenna pattern 12 and the antenna pattern 13 may be a patch antenna. In some embodiments, each of the antenna patterns 12 and 13 may include a conductive material such as a metal or metal alloy. Examples of the conductive material include gold (Au), silver (Ag), aluminum (Al), copper (Cu), or an alloy thereof. In some embodiments, the antenna pattern 12 and the antenna pattern 13 may also be referred to as an antenna layer.

In some embodiments, the antenna module 11 may only include the antenna pattern 12, and the antenna pattern 13 may be omitted. In some embodiments, in compared with the embodiments only having the antenna pattern 12, the embodiments having the antenna pattern 12 and the antenna pattern 13 can achieve a higher frequency wireless transmission.

The antenna pattern 12 is electrically connected to the substrate 10 (such as the RDL 10r of the substrate 10) through, for example but is not limited to, the feeding line 11c. In some embodiments, the antenna pattern 12 is electrically connected to the electronic component module 14 through, for example but is not limited to, the feeding line 11c. In some embodiments, the feeding line 11c may provide a signal to the antenna pattern 12. For example, the signal may be transmitted between the RDL 10r, the feeding line 11c and the antenna pattern 12. The feeding line 11c is disposed between the substrate 10 and the antenna pattern 12. The feeding line 11c is disposed within the set of dielectric layer(s) 11d2. The feeding line 11c is surrounded by the set of dielectric layer(s) 11d2. The feeding line 11c passes through the set of dielectric layer(s) 11d2.

In some embodiments, the signal transmission path between the substrate 10 and the antenna pattern 12 through the feeding line 11c may be substantially perpendicular to the surface 101 of substrate 10.

In some embodiments, the feeding line 11c may include, but not limited to, a metal pillar, a bonding wire or stacked vias. In some embodiments, the feeding line 11c may include Au, Ag, Al, Cu, or an alloy thereof.

The electronic component module 14 is disposed on the surface 101 of the substrate 10. As mentioned, the electronic component module 14 and the antenna module 11 are disposed side-by-side. The electronic component module 14 and the antenna module 11 are located at different areas of the substrate 10. The electronic component module 14 is laterally spaced apart from the antenna module 11. The electronic component module 14 is laterally physically isolated from the antenna module 11.

The electronic component module 14 includes a substrate 14s, electronic components 14a and 14b, and a package body 14p. In some embodiments, the substrate 14s is a fan-out substrate. The substrate 14s includes an interconnection layer 14r. In some embodiments, the interconnection layer 14r may include a fan-out structure. In some embodiments, the interconnection layer 14r may function as a RF routing layer to transmit signals.

Each of the electronic components 14a and 14b may be electrically connected to one or more of another electrical component and to the substrate 10 (e.g., to the RDL 10r) through the interconnection layer 14r, and electrical connection may be attained by way of flip-chip or wire-bond techniques. The package body 14p is formed on the substrate 14s to encapsulate the electronic components 14a and 14b.

Each of the electronic components 14a and 14b may be a chip or a die including a semiconductor substrate, one or more integrated circuit devices and one or more overlying interconnection structures therein. The integrated circuit devices may include active devices such as transistors and/or passive devices such as resistors, capacitors, inductors, or a combination thereof. In some embodiments, each of the electronic components 14a and 14b may be a transmitter, a receiver, or a transceiver. In some embodiments, each of the electronic components 14a and 14b may include power management integrated circuits (PMICs). Although there are two electronic components in FIG. 1, the number of the electronic components is not limited thereto. In some embodiments, there may be any number of electronic components in the electronic component module 14 depending on design requirements.

The package body 15 is formed on the substrate 10 to encapsulate the electronic component module 14 and the antenna module 11. The package body 15 also encapsulates the package body 14p of the electronic component module 14. In some embodiments, an interface between the package body 15 and the package body 14p can be observed. In some embodiments, the package body 15 and the package body 14p may include the same material and there is no interface between the package body 15 and the package body 14p.

In some embodiments, the package body 15 includes an epoxy resin having fillers, a molding compound (e.g., an epoxy molding compound or other molding compound), a polyimide, a phenolic compound or material, a material with a silicone dispersed therein, or a combination thereof. In some embodiments, the material of the package body 15 is different from the material of each layer of the set of dielectric layer(s) 11d1 and the set of dielectric layer(s) 11d2.

The electrical contact 16 (e.g. a solder ball) is disposed on the surface 102 of the substrate 10 and can provide electrical connections between the semiconductor package device 1 and external components (e.g. external circuits or circuit boards). In some embodiments, the electrical contact 16 includes a controlled collapse chip connection (C4) bump, a ball grid array (BGA) or a land grid array (LGA).

In a comparative embodiment, the electronic component module 14 (with substrate 14s) may be stacked with the antenna module 11. For example, the electronic component module 14 may be disposed on the surface 112 of the antenna module 11, and the antenna module 11 is packaged with RF routing layers for connecting to the electronic component module 14. The interconnection layer 14r may be stacked with the dielectric layers of RF routing layers of the antenna module 11. In this stacked arrangement, more dielectric layers (compared to the side-by-side arrangement) were required to maintain the symmetry of the whole package. However, as the number of dielectric layers increases, the yield rate would decrease. In addition, in the antenna module 11 with RF routing layers, the copper laying rate mismatch between the antenna layer and the RF routing layer often renders processing difficulties.

By separately forming the electronic component module 14 and the antenna module 11 and then placing them side-by-side on the substrate 10, there is no need to provide additional dielectric layers in the antenna module 11. The number of dielectric layers can be decreased, and the entire thickness of the antenna module 11 reduced without compromising symmetry of the antenna module 11. In addition, by removing the RF routing layer outside of the antenna module 11, the mismatch in copper laying rate can be reduced. Besides, the electronic component module 14 and the antenna module 11 can be tested separately before mounting on a carrier (such as the substrate 10). Therefore, the yield rate can be improved.

Figure 2:
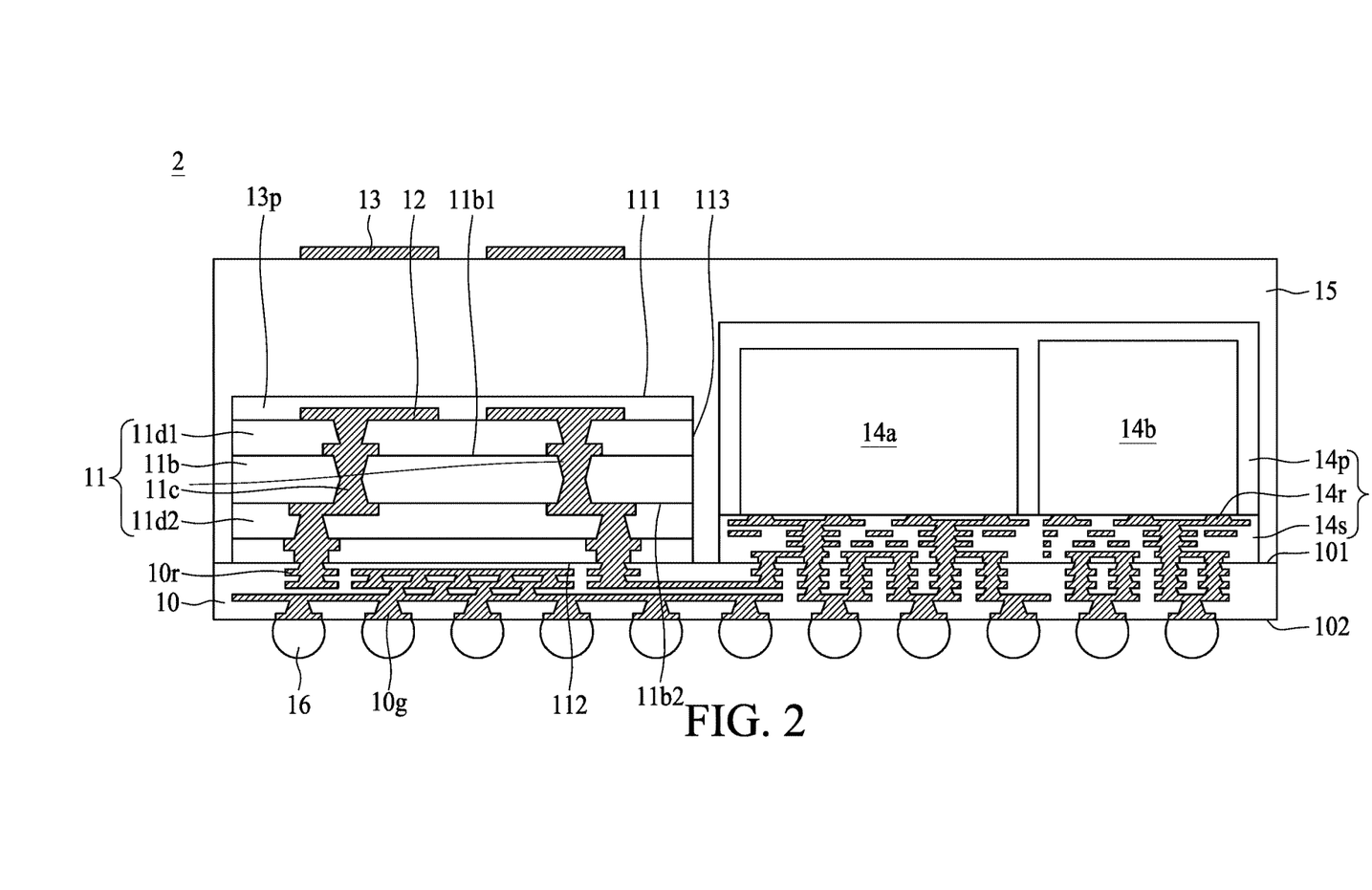
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 of FIG. 2 is similar to the semiconductor device package 1 of FIG. 1, and the differences therebetween are described below.

In FIG. 2, the antenna pattern 13 is disposed on the package body 15. The antenna pattern 12 is aligned with the antenna pattern 13. In the embodiments, signals can be transmitted between the antenna pattern 12 and the antenna pattern 13 through coupling.

In some embodiments, the material of the package body 15 is different from the material of each layer of the set of dielectric layer(s) 11d1 and the set of dielectric layer(s) 11d2. Thus, the coupling medium of the antenna module 11 is different from the medium for supporting the feeding line 11c. In other words, the signal transmission path between the substrate 10 and the antenna pattern 12, and the signal coupling between the antenna pattern 12 and the antenna pattern 13 employ different materials.

In compared with the semiconductor device package 1 in FIG. 1, the number of dielectric layers can be decreased, and thus the yield rate can be improved.

In some embodiments, the antenna module 11 may only include the antenna pattern 12, and the antenna pattern 13 may be omitted. In some embodiments, in compared with the embodiments without the antenna pattern 13, the embodiments having both the antenna pattern 12 and the antenna pattern 13 can achieve a higher frequency wireless transmission.

Figure 3:
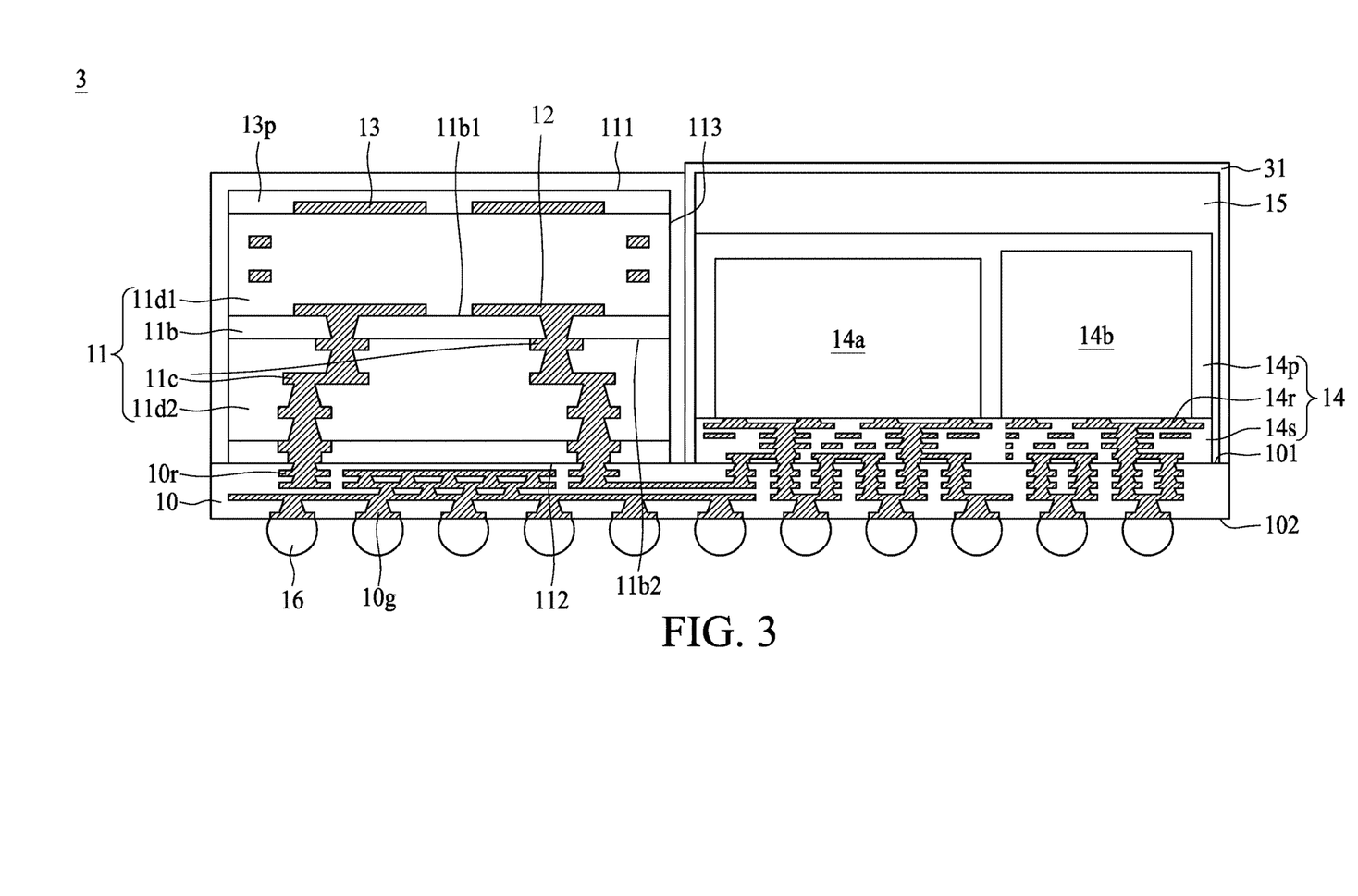
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 of FIG. 3 is similar to the semiconductor device package 1 of FIG. 1, and the differences therebetween are described below.

In FIG. 3, the semiconductor device package 3 further includes a shielding layer 31 disposed on the package body 15. The shielding layer 31 can be used to provide an electromagnetic interference (EMI) protection for the electronic components 14a and 14b.

In some embodiments, the shielding layer 31 is a conductive thin film, and may include, for example, Au, Ag, Al, Cu, chromium (Cr), tin (Sn), nickel (Ni) or stainless steel, or a mixture, an alloy, or other combination thereof. The shielding layer 14 may include a single conductive layer or multiple conductive layers. In some embodiments, the shielding layer 31 includes multiple conductive layers, and the multiple conductive layers may include a same material, or ones of the multiple conductive layers may include different materials, or each of the multiple conductive layers may include different materials from others of the multiple conductive layers.

Figure 4:
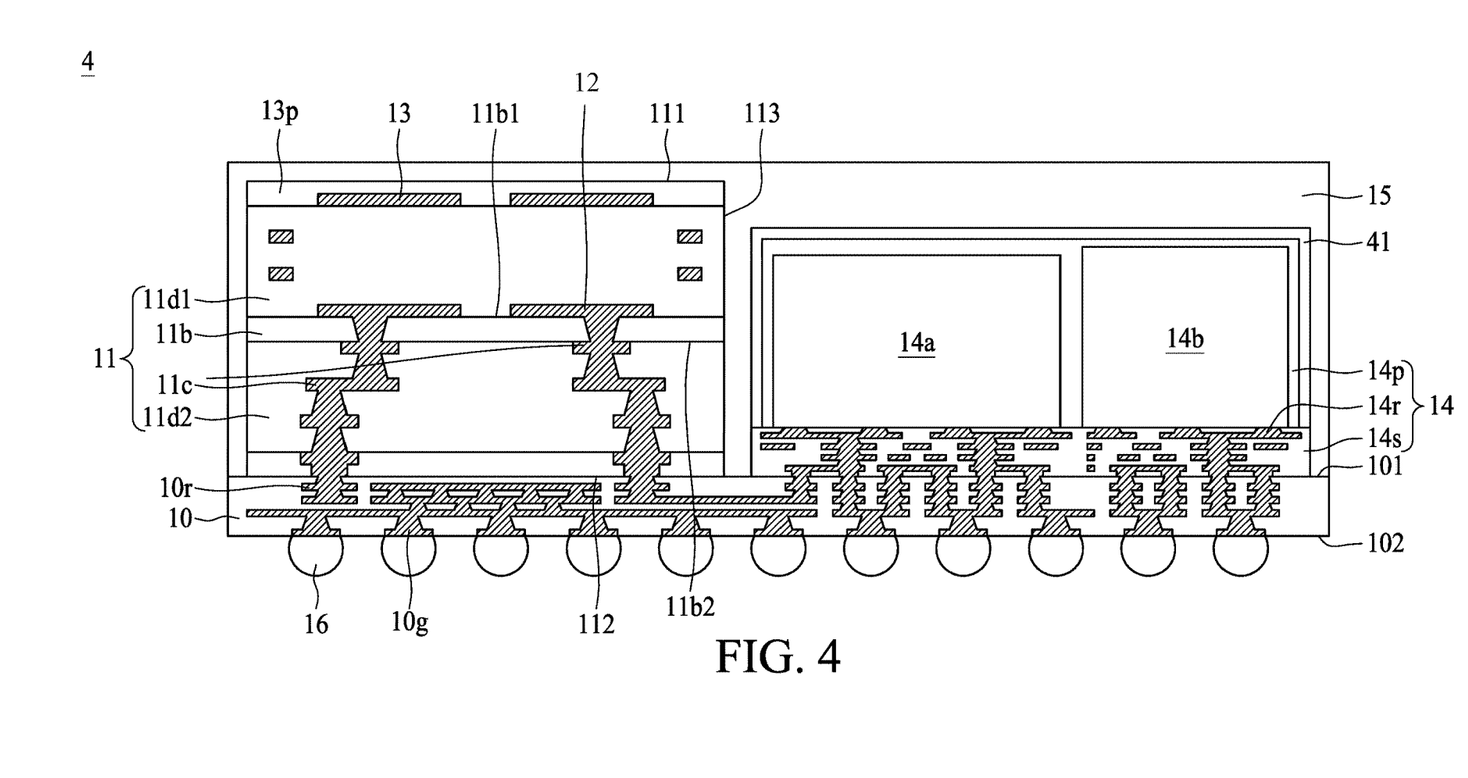
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 of FIG. 4 is similar to the semiconductor device package 1 of FIG. 1, and the differences therebetween are described below.

In FIG. 4, the semiconductor device package 4 further includes a shielding layer 41 disposed on an external surface of the package body 14p and covers the package body 14p, and the electrical components 14a and 14b.

FIGS. 5A, 5B, 5C, and 5D, are cross-sectional views of a semiconductor device package at various stages of fabrication, in accordance with some embodiments of the present disclosure. At least some of these figures have been simplified for a better understanding of the aspects of the present disclosure.

Figure 5A:
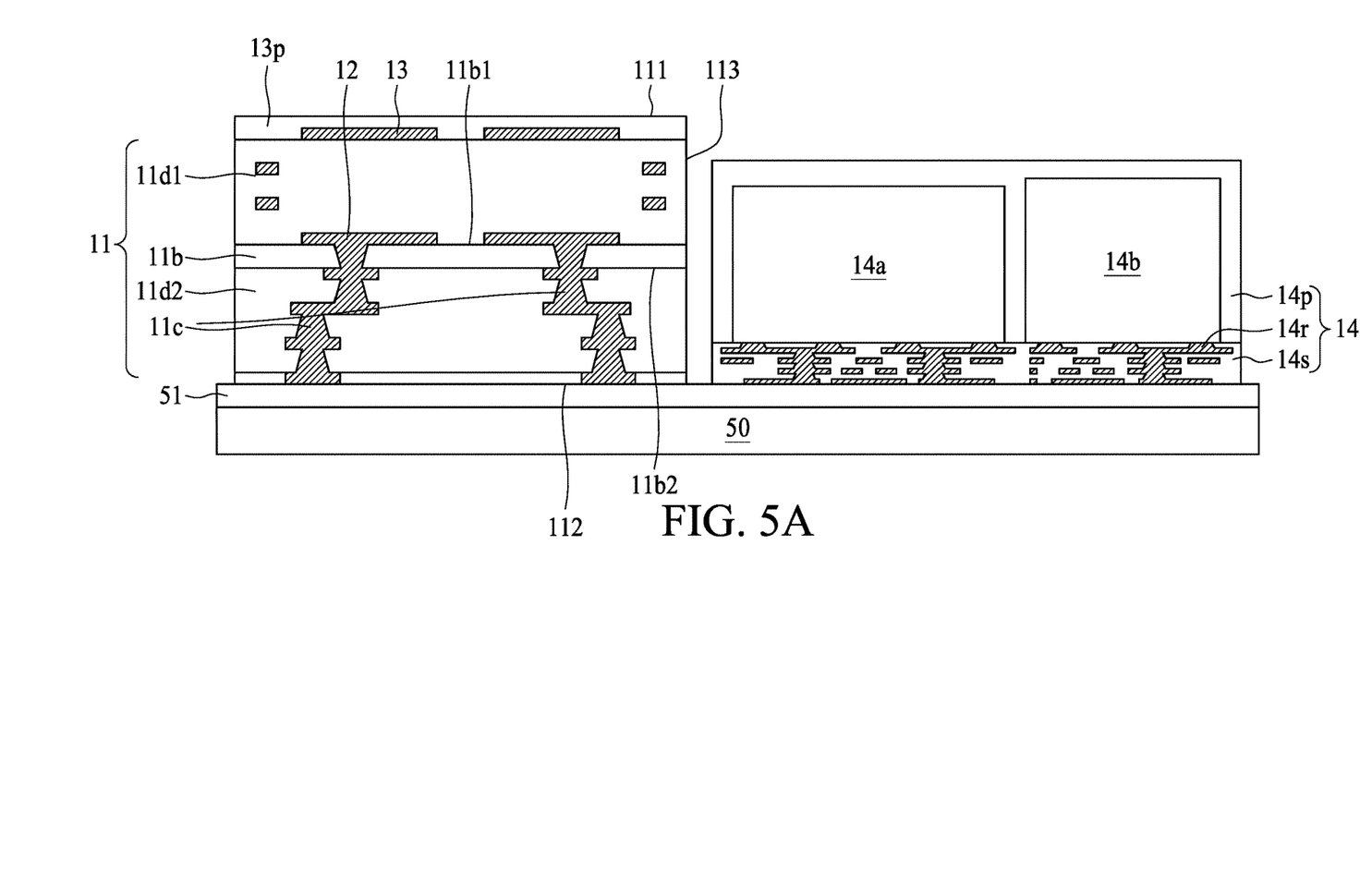
FIG. 5A illustrates one or more stages of a method of manufacturing a semiconductor device package in accordance with some embodiments of the present disclosure.

Referring to FIG. 5A, an antenna module 11 and an electronic component module 14 are provided on a carrier 50 through an adhesive layer 51. The antenna module 11 has a surface 111 facing away from the carrier 50, a surface 112 opposite to the surface 111, and a lateral surface 113 extending between the surface 111 and the surface 112. The lateral surface 113 of the antenna module 11 faces the electronic component module 14.

The antenna module 11 includes a substrate 11b, a set of dielectric layer(s) 11d1, a set of dielectric layer(s) 11d2, a feeding line 11c. An antenna pattern 12 is disposed within at least one of the set of dielectric layer(s) 11d1. An antenna pattern 13 is disposed on the set of dielectric layer(s) 11d1 and aligned with the antenna pattern 12.

The electronic component module 14 includes a substrate 14s, electronic components 14a and 14b, and a package body 14p. The substrate 14s includes an interconnection layer 14r.

Figure 5B:
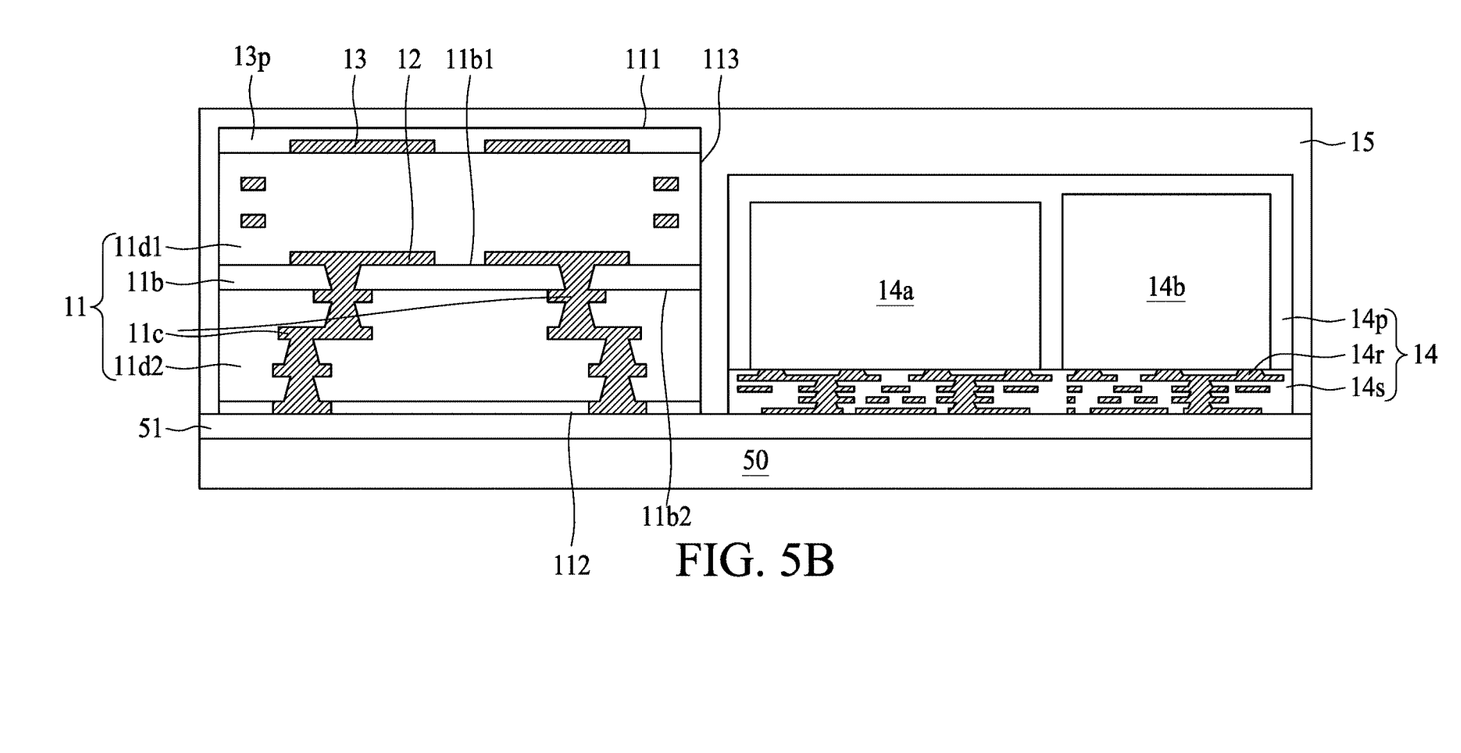
FIG. 5B illustrates one or more stages of a method of manufacturing a semiconductor device package in accordance with some embodiments of the present disclosure.

Referring to FIG. 5B, a package body 15 is disposed on the carrier 50 to encapsulate the antenna module 11 and the electronic component module 14. The package body 15 may be formed by a molding technique, such as transfer molding or compression molding.

Figure 5C:
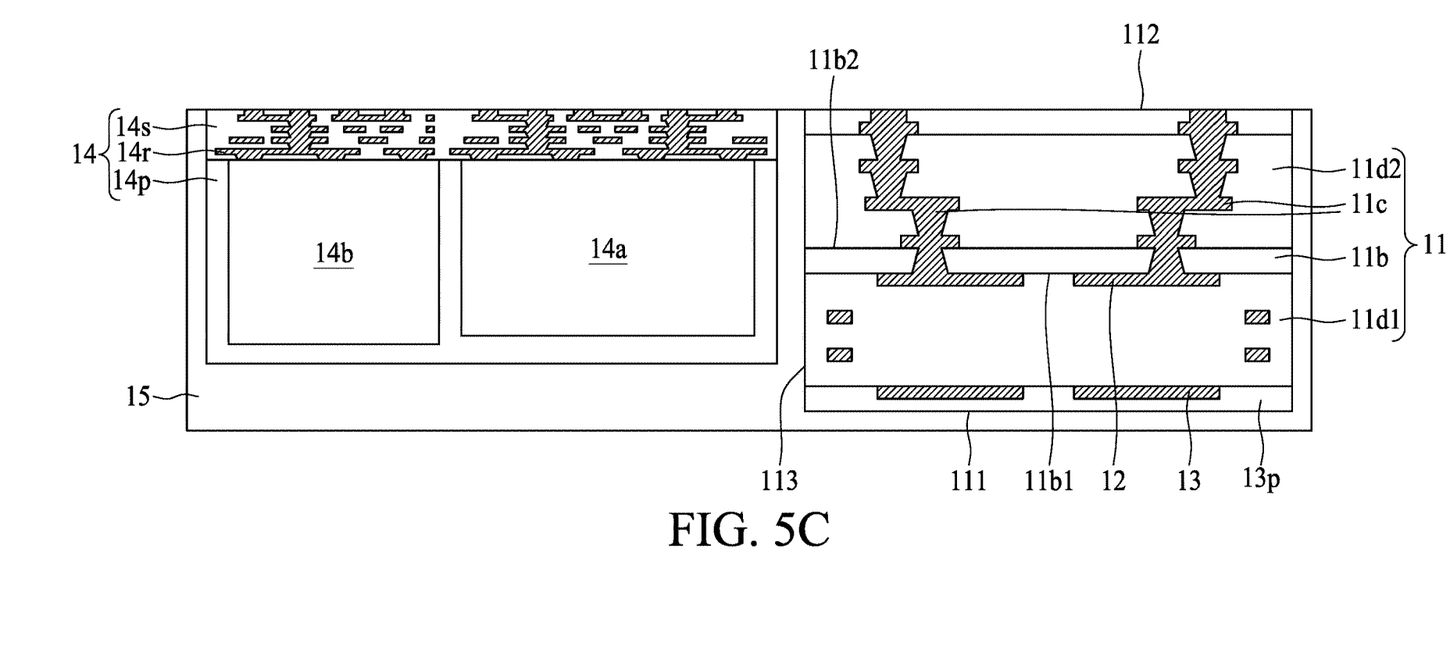
FIG. 5C illustrates one or more stages of a method of manufacturing a semiconductor device package in accordance with some embodiments of the present disclosure.

Referring to FIG. 5C, the carrier 50 and the adhesive layer 51 are removed from the package body 15. The feeding line 11c is exposed from the surface 112 of the antenna module 11. The interconnection layer 14r is exposed from the bottom surface of the electronic component module 14. The antenna module 11, the electronic component module 14, and the package body 15 are turned over as shown in FIG. 5C.

Figure 5D:
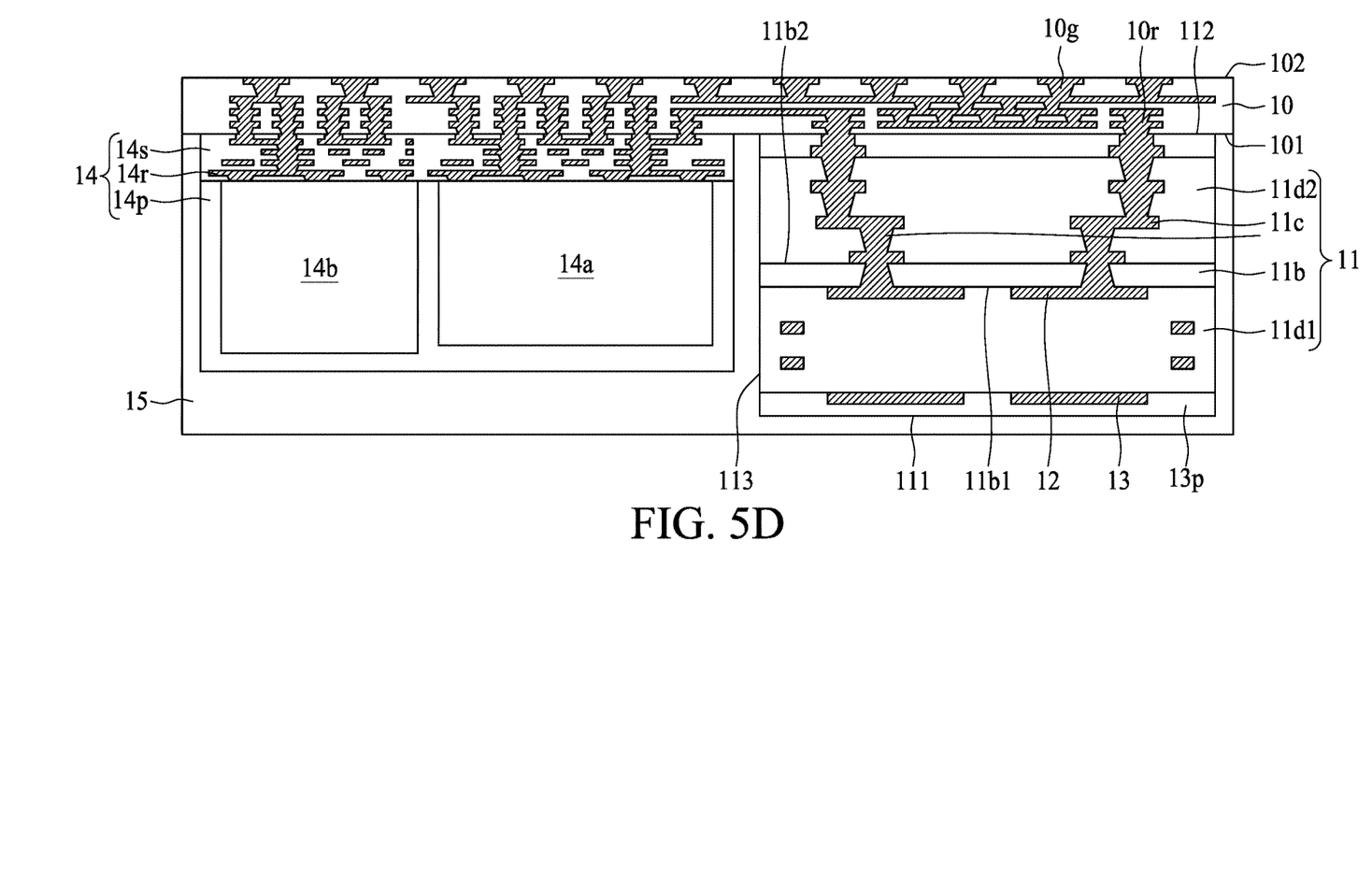
FIG. 5D illustrates one or more stages of a method of manufacturing a semiconductor device package in accordance with some embodiments of the present disclosure.

Referring to FIG. 5D, a substrate 10 is provided on the antenna module 11 and the electronic component module 14. The substrate 10 is provided on the feeding line 11c and the interconnection layer 14r. The substrate 10 has a RDL 10r electrically connected to the feeding line 11c and the interconnection layer 14r. In some embodiments, after the carrier 50 and the adhesive layer 51 are removed, a grounding layer 10g is provided on the antenna module 11 and the electronic component module 14. In some embodiments, the grounding layer 10g is provided in corresponding to the antenna pattern 12 and/or the antenna pattern 13. In some embodiments, the grounding layer 10g is aligned with the antenna pattern 12 and/or the antenna pattern 13. An electrical contact (such as the electrical contact 16 in FIG. 1) may be provided on a surface 102 of the substrate 10. The structure manufactured through the operations illustrated in FIGS. 5A, 5B, 5C, and 5D may be similar to the semiconductor device package 1 in FIG. 1.

In some embodiments, since the RDL 10r and the grounding layer 10g are formed after molding, as illustrated in FIG. 5B, the RDL 10r and the grounding layer 10g can be generally even. For example, in FIG. 5D, the RDL 10r and the grounding layer 10g can be formed without the gravity concerns of the antenna module 11 and the electronic component module 14.

FIGS. 6A, 6B, 6C, and 6D, are cross-sectional views of a semiconductor device package at various stages of fabrication, in accordance with some embodiments of the present disclosure. At least some of these figures have been simplified for a better understanding of the aspects of the present disclosure. The operations of FIGS. 6A, 6B, 6C, and 6D are similar to the operations of FIGS. 5A, 5B, 5C, and 5D, and the differences therebetween are described below.

Figure 6A:
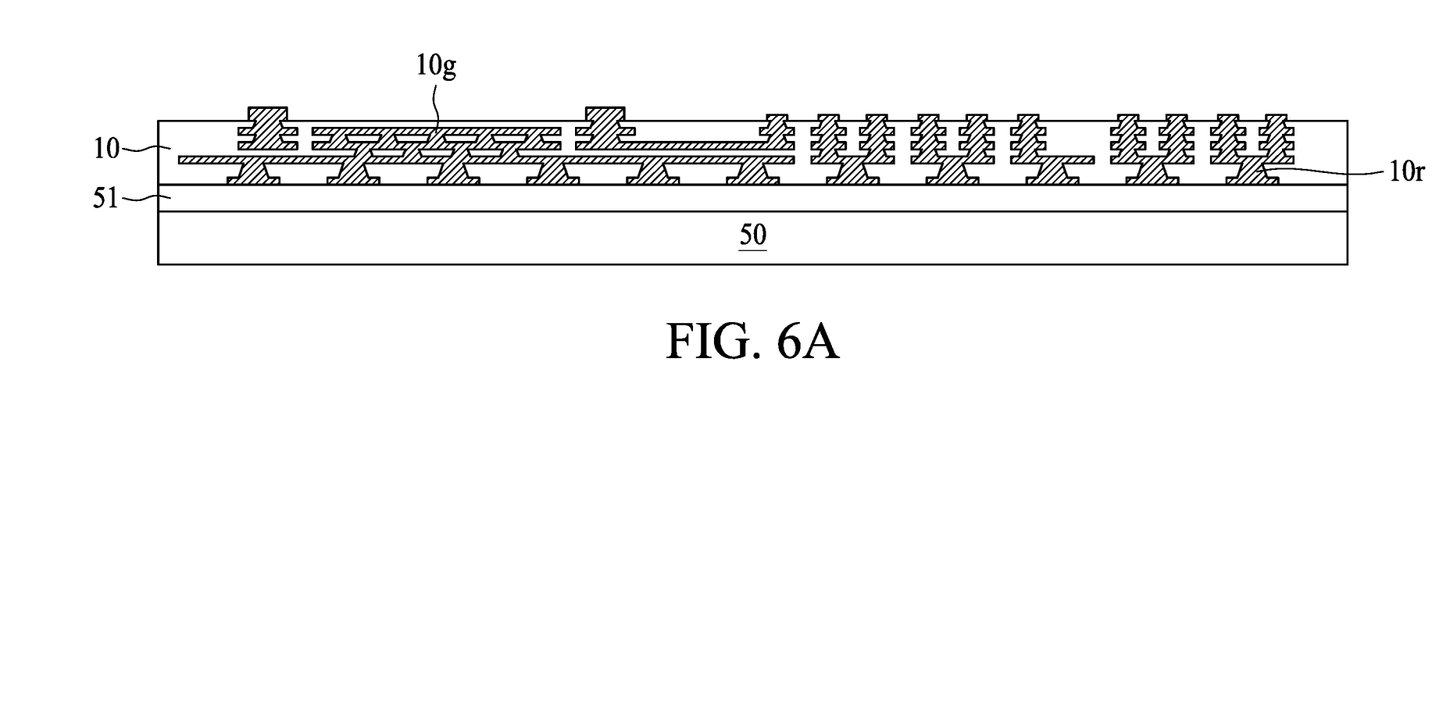
FIG. 6A illustrates one or more stages of a method of manufacturing a semiconductor device package in accordance with some embodiments of the present disclosure.
Figure 6B:
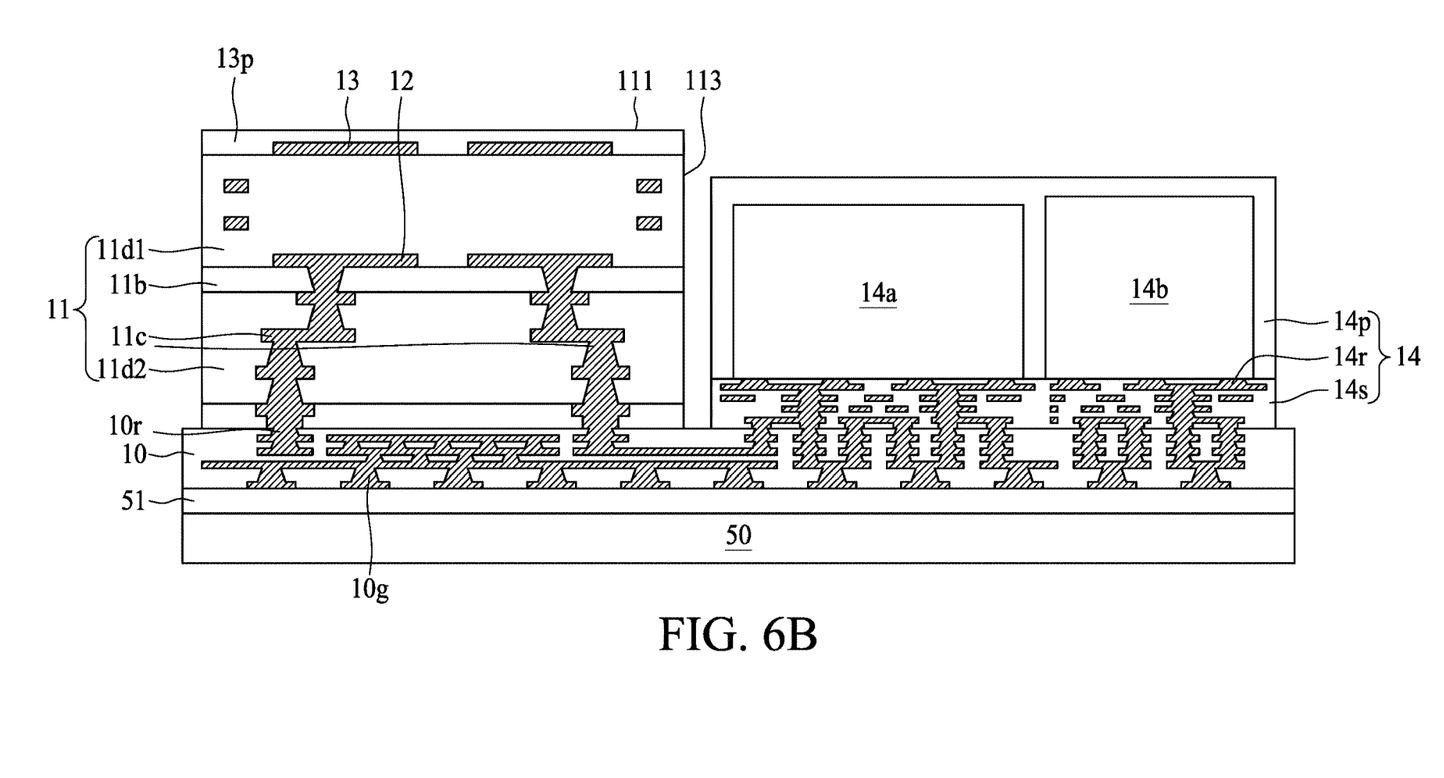
FIG. 6B illustrates one or more stages of a method of manufacturing a semiconductor device package in accordance with some embodiments of the present disclosure.
Figure 6C:
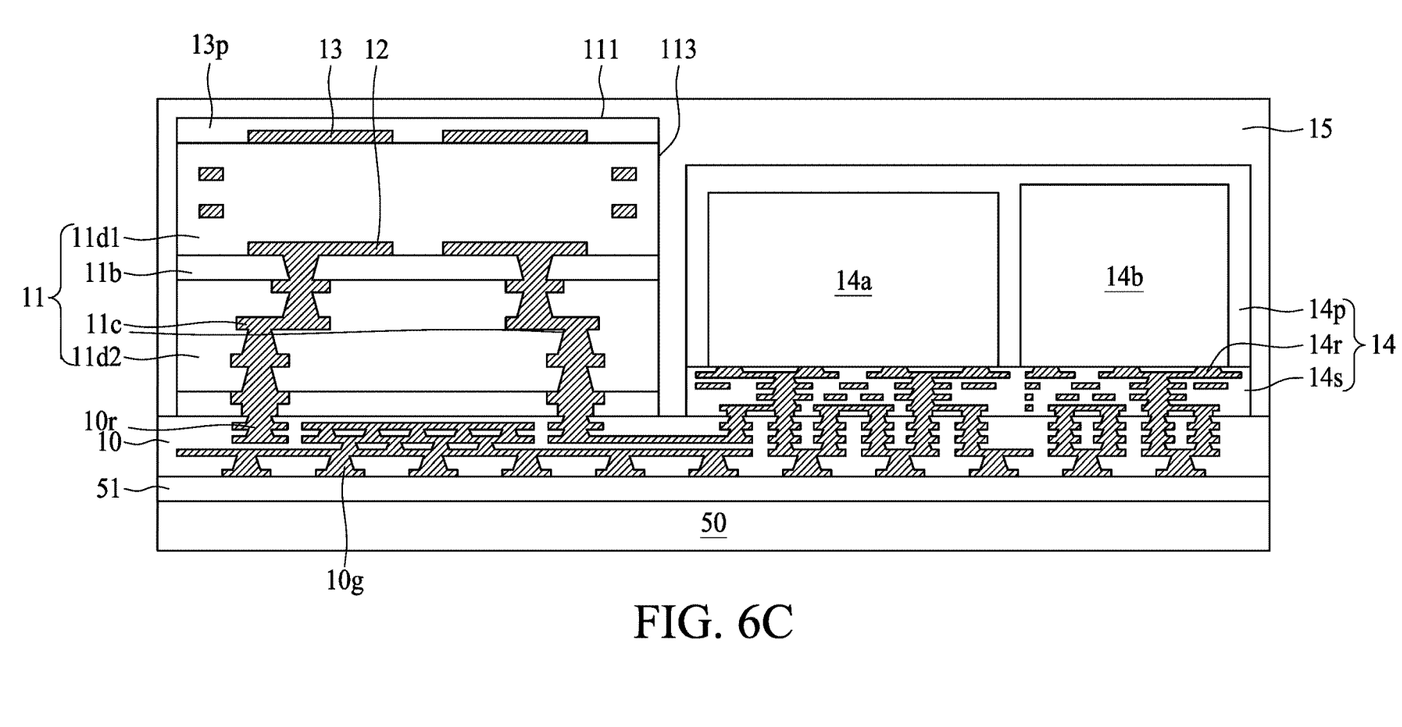
FIG. 6C illustrates one or more stages of a method of manufacturing a semiconductor device package in accordance with some embodiments of the present disclosure.

In the operations of FIGS. 6A, 6B, 6C, and 6D, the RDL 10r and the grounding layer 10g are formed before the molding operation as illustrated in FIG. 6C.

Referring to FIG. 6A, the substrate 10 including the RDL 10r and the grounding layer 10g is disposed on the carrier 50 through the adhesive layer 51.

Referring to FIG. 6B, the antenna module 11 and the electronic component module 14 are provided on the substrate 10.

Referring to FIG. 6C, the package body 15 is disposed on the substrate 10 to encapsulate the antenna module 11 and the electronic component module 14.

Figure 6D:
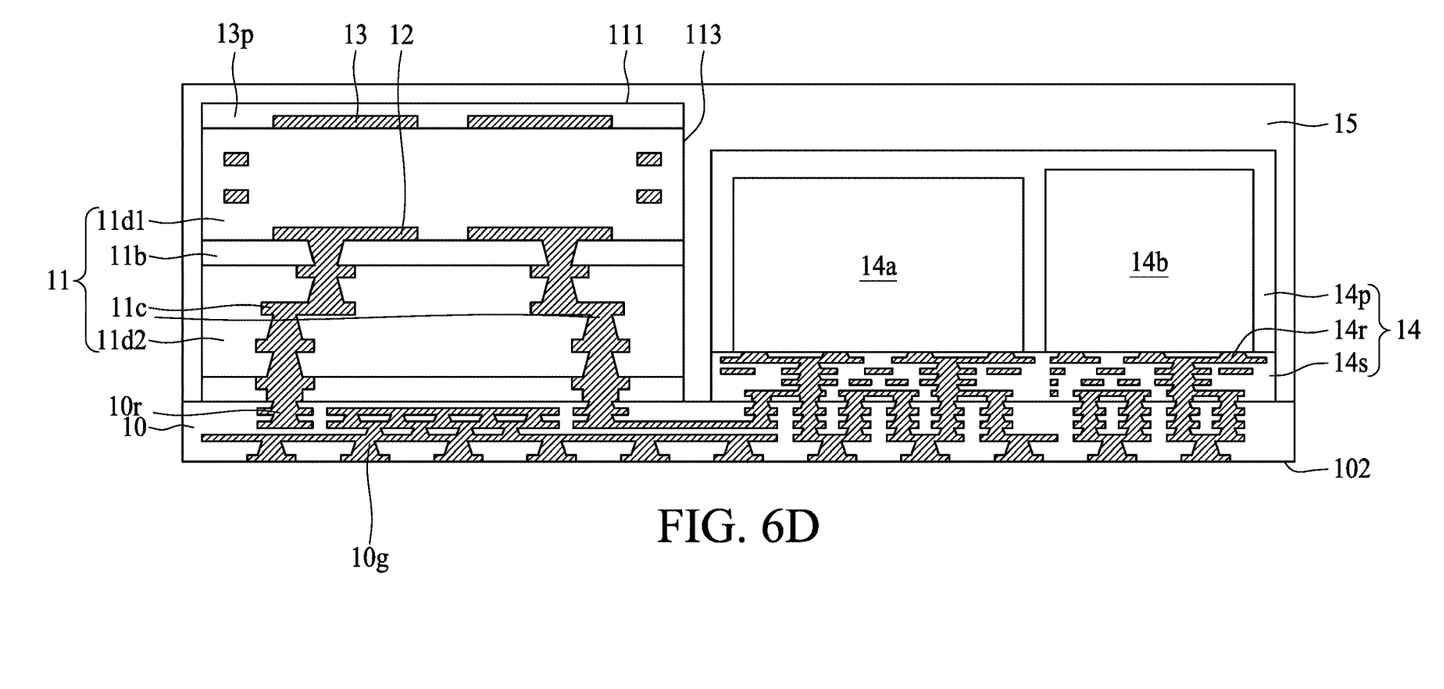
FIG. 6D illustrates one or more stages of a method of manufacturing a semiconductor device package in accordance with some embodiments of the present disclosure.

Referring to FIG. 6D, the carrier 50 and the adhesive layer 51 are removed from the substrate 10. An electrical contact (such as the electrical contact 16 in FIG. 1) may be provided on a surface 102 of the substrate 10. The structure manufactured through the operations illustrated in FIGS. 6A, 6B, 6C, and 6D may be similar to the semiconductor device package 1 in FIG. 1.

In some embodiments, since the RDL 10r and the grounding layer 10g are formed before the molding operation as illustrated in FIG. 6C, photolithographic operations of the RDL 10r and the grounding layer 10g (such as the operation in FIG. 6A) can be reworked, if needed, without discarding the antenna module 11 and the electronic component module 14. Therefore, the yield rate can be improved.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within +10%, ±5%, +1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (m) of lying along the same plane, such as within 10 m, within 5 m, within 1 m, or within 0.5 m of lying along the same plane. When referring to numerical values or characteristics as "substantially" the same, the term can refer to the values lying within ±10%, ±5%, ±1%, or +0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
a first substrate having a surface;
an antenna module disposed on the surface of the first substrate, the antenna module comprising a first antenna pattern and multiple dielectric layers between the first substrate and the first antenna pattern; and
an electronic component module disposed on the surface of the first substrate and adjacent to the antenna module, wherein the electronic component module is electrically connected to the antenna module through the first substrate;
wherein the antenna module further comprises:
a second substrate having a first surface facing away from the first substrate and a second surface opposite to the first surface of the second substrate;
a first dielectric layer of the multiple dielectric layers disposed on the first surface of the second substrate; and
a second dielectric layer of the multiple dielectric layers disposed on the second surface of the second substrate;
wherein the electronic component module is electrically connected to the second substrate of the antenna module through the first substrate.

2. The semiconductor device package as claimed in claim 1, wherein the antenna module further comprises:
a feeding line disposed within the second dielectric layer and electrically connected to the first substrate.

3. The semiconductor device package as claimed in claim 1, wherein a number of layers of the multiple dielectric layers disposed on the first surface of the second substrate is the same as a number of layers of the multiple dielectric layers disposed on the second surface of the second substrate.

4. The semiconductor device package as claimed in claim 1, wherein a thickness of layers of the multiple dielectric layers disposed on the first surface of the second substrate is substantially the same as a thickness of layers of the multiple dielectric layers disposed on the second surface of the second substrate.

5. The semiconductor device package as claimed in claim 1, wherein the antenna module further comprises a second antenna pattern within the first dielectric layer, wherein the second antenna pattern is substantially aligned with the first antenna pattern.

6. The semiconductor device package as claimed in claim 1, further comprising:
a first package body encapsulating the antenna module and the electronic component module; and
a third antenna pattern disposed on the first package body, wherein the third antenna pattern is substantially aligned with the first antenna pattern.

7. The semiconductor device package as claimed in claim 6, wherein a material of the first dielectric layer is different from a material of the first package body.

8. The semiconductor device package of claim 6, further comprising a shielding layer disposed on the first package body.

9. The semiconductor device package of claim 6, wherein the electronic component module further comprises:
a third substrate physically separated from the second substrate and electrically connected with the second substrate through the first substrate; and
an electronic component disposed on the third substrate and connected to the first substrate through the third substrate.

10. The semiconductor device package of claim 9, wherein the third substrate of the electronic component module is encapsulated by the first package body.

11. The semiconductor device package of claim 10, further comprising:
a second package body encapsulating the electronic component and encapsulated by the first second package body; and
a shielding layer disposed on the second package body and in contact with the third substrate of the electronic component module.

12. A semiconductor device package, comprising:
a first substrate having a first surface and a second surface opposite to the first surface of the first substrate;
an antenna module disposed on the first surface of the first substrate, the antenna module having a first surface facing the first surface of the first substrate, a second surface opposite to the first surface of the antenna module, and a lateral surface extending between the first surface of the antenna module and the second surface of the antenna module;

an electronic component module disposed on the first surface of the first substrate, wherein the lateral surface of the antenna module faces the electronic component module; and a first package body encapsulating the antenna module and the electronic component module;

wherein the antenna module further comprises:
- a second substrate having a first surface facing away from the first substrate and a second surface opposite to the first surface of the second substrate;
- a first set of dielectric layers disposed on the first surface of the second substrate; and
- a first antenna pattern disposed within at least one of the first set of dielectric layers; and wherein the first substrate further comprises a grounding layer at least substantially aligned with the first antenna pattern.

13. A semiconductor device package, comprising:
a first substrate having a surface;
an electronic component disposed on the surface of the first substrate;
an antenna module disposed on the surface of the first substrate and adjacent to the electronic component, the antenna module comprising a first antenna layer and multiple dielectric layers between the first substrate and the first antenna layer;
a first package body encapsulating the antenna module; and
a second antenna layer disposed on the first package body and substantially aligned with the first antenna layer.

14. The semiconductor device package of claim 13, wherein the antenna module further comprising:
- a carrier having a first surface and a second surface opposite to the first surface of the carrier;
- a first dielectric layer of the multiple dielectric layers disposed on the first surface of the carrier, the first antenna layer being disposed on the first dielectric layer of the multiple dielectric layers;
- a second dielectric layer of the multiple dielectric layers disposed on the second surface of the carrier; and
- a feeding line disposed within the second dielectric layer of the multiple dielectric layers and electrically connected to the first antenna layer and the first substrate.

15. The semiconductor device package as claimed in claim 14, wherein a thickness of the first dielectric layer is substantially the same as a thickness of the second dielectric layer.

16. The semiconductor device package as claimed in claim 13, wherein the first package body further encapsulates the electronic component.

17. The semiconductor device package of claim 13, wherein the first substrate further comprises a grounding layer at least substantially aligned with the first antenna layer.

18. The semiconductor device package of claim 13, further comprising:
- a second package body encapsulating the electronic component and encapsulated by the first second package body.

* * * * *